United States Patent
Fitzsimmons et al.

(10) Patent No.: US 7,670,497 B2
(45) Date of Patent: Mar. 2, 2010

(54) OXIDANT AND PASSIVANT COMPOSITION AND METHOD FOR USE IN TREATING A MICROELECTRONIC STRUCTURE

(75) Inventors: John A. Fitzsimmons, Poughkeepsie, NY (US); David L. Rath, Stormville, NY (US); Shom Ponoth, Guilderland, NY (US); Michael Beck, Dressen (DE)

(73) Assignees: International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 408 days.

(21) Appl. No.: 11/774,041

(22) Filed: Jul. 6, 2007

(65) Prior Publication Data

US 2009/0008361 A1    Jan. 8, 2009

(51) Int. Cl.
   *H01B 13/00*   (2006.01)
(52) U.S. Cl. .............................. 216/13; 216/17; 216/66; 216/83; 216/105; 216/106; 438/704
(58) Field of Classification Search .................... 216/13, 216/17, 66, 83, 105, 106; 438/704
See application file for complete search history.

(56) References Cited

U.S. PATENT DOCUMENTS

| | | | |
|---|---|---|---|
| 2002/0134963 A1* | 9/2002 | Peyne et al. ................ | 252/79.1 |
| 2003/0181342 A1 | 9/2003 | Seijo et al. | |
| 2004/0065547 A1 | 4/2004 | Stevens et al. | |
| 2004/0087141 A1* | 5/2004 | Ramanathan et al. ........ | 438/678 |
| 2004/0108302 A1 | 6/2004 | Liu et al. | |
| 2004/0132308 A1 | 7/2004 | Obeng | |
| 2005/0003674 A1 | 1/2005 | Wojtczak et al. | |
| 2005/0124517 A1 | 6/2005 | Wojtczak et al. | |
| 2005/0126588 A1 | 6/2005 | Carter et al. | |
| 2005/0205522 A1 | 9/2005 | Ho et al. | |
| 2006/0070979 A1 | 4/2006 | Christenson et al. | |
| 2007/0082491 A1* | 4/2007 | Uozumi et al. .............. | 438/692 |
| 2007/0123034 A1* | 5/2007 | Schuehrer et al. ........... | 438/628 |
| 2008/0207005 A1* | 8/2008 | Farkas ......................... | 438/745 |
| 2008/0254625 A1* | 10/2008 | Sharma ....................... | 438/689 |
| 2009/0212021 A1* | 8/2009 | Bernhard et al. ............ | 216/109 |

* cited by examiner

*Primary Examiner*—Binh X Tran
(74) *Attorney, Agent, or Firm*—Scully, Scott, Murphy & Presser, P.C.; H. Daniel Schnurmann

(57) ABSTRACT

A composition that may be used for cleaning a metal containing conductor layer, such as a copper containing conductor layer, within a microelectronic structure includes an aqueous acid, along with an oxidant material and a passivant material contained within the aqueous acid. The composition does not include an abrasive material. The composition is particularly useful for cleaning a residue from a copper containing conductor layer and an adjoining dielectric layer that provides an aperture for accessing the copper containing conductor layer within a microelectronic structure.

1 Claim, 2 Drawing Sheets

OXIDANT AND PASSIVANT COMPOSITION AND METHOD FOR USE IN TREATING A MICROELECTRONIC STRUCTURE

BACKGROUND

1. Field of the Invention

The invention relates generally to microelectronic structures. More particularly, the invention relates to compositions and methods for effectively cleaning and passivating copper containing conductor layers within microelectronic structures.

2. Description of the Related Art

Microelectronic structures, including in particular semiconductor structures, often include microelectronic devices, such as semiconductor devices. Particular examples of microelectronic devices include, but are not limited to resistors, transistors, diodes and capacitors. Resistors and capacitors are generally categorized as passive devices that need not necessarily comprise semiconductor materials, and often do not comprise semiconductor materials. Transistors and diodes are generally categorized as active devices that of necessity comprise semiconductor materials. Within semiconductor and microelectronic structures, microelectronic devices are generally connected and interconnected while using patterned conductor layers that are separated by dielectric layers.

As microelectronic technology, and in particular semiconductor technology, has advanced, the use of copper containing conductor materials for fabricating patterned conductor layers for interconnecting microelectronic devices within microelectronic structures has become more prevalent. Copper containing conductor materials are particularly desirable for fabricating such patterned conductor layers insofar as copper containing conductor materials provide for generally high current densities while simultaneously avoiding electromigration effects. Electromigration effects may be particularly prevalent within other types of conductor materials that may be used for patterned conductor layers, such as aluminum containing conductor materials and gold containing conductor materials.

While copper containing conductor materials are thus desirable for fabricating patterned conductor layers within microelectronic structures, copper containing conductor materials themselves are not entirely without problems within that application. In particular, copper containing conductor materials are often more susceptible to undesirable surface oxidation than other types of conductor materials, such as aluminum containing conductor materials and gold containing conductor materials. Absent effective removal of undesirable copper oxide residues that result from copper oxidation, such copper oxide residues may yield increased contact resistances within microelectronic circuits within which are used the copper containing conductor materials.

Various methods and compositions for cleaning, protecting or processing various microelectronic structures, including copper containing conductor layers within microelectronic structures, are known in the microelectronic fabrication art.

For example, Seijo, in U.S. Pub. No. 2003/0181342, teaches a semi-aqueous composition for removing particles from a semiconductor substrate. The semi-aqueous composition includes a buffering material, a polar organic solvent and a fluoride material.

In addition, Stevens, et al., in U.S. Pub. No. 2004/0065547, teaches a real time component monitoring and replenishment system for use with a multicomponent semiconductor processing composition. The system is particularly useful in photoresist and post-etch residue removal, where a water concentration may desirably be monitored and replenished.

Further, Liu et al., in U.S. Pub. No. 2004/0108302, teaches a passivating chemical mechanical polish planarizing composition for use when planarizing copper containing conductor materials. The composition includes an aminotriazole absent benzotriazole, in conjunction with an oxidizing material, a chelating material, an abrasive material and a solvent.

Still further, Obeng, in U.S. Pub. No. 2004/0132308, teaches a corrosion retarding polishing slurry composition for chemical mechanical polishing of copper containing conductor layers. The polishing slurry composition uses an acidic buffer material in a range from about 1 to about 6, or alternatively in a range from about 2.5 to about 4.

Still even further, Wojtczak et al., in U.S. Pub Nos. 2005/0003674 and 2005/0124517, teaches an aqueous cleaning composition for cleaning inorganic residues from a semiconductor substrate. The composition includes a fluoride material, an organic amine, an imine or a nitrogen containing carboxylic acid and a metal chelating material.

Still yet further, Carter et al., in U.S. Pub. No. 2005/0126588, teaches a corrosion inhibiting chemical mechanical polish slurry and cleaner composition. The composition includes an oxidant, a salicylic acid material and water.

Additionally, Ho et al., in U.S. Pub. No. 2005/0205522, teaches a corrosion inhibiting additive for use within a chemical mechanical polish planarizing slurry composition. The corrosion inhibiting additive includes a carbonyl derivative of benzotriazole.

Finally, Christenson et al., in U.S. Pub. No. 2006/0070979, teaches an oxidizing method for treating a substrate that may comprise a copper containing conductor material and a low dielectric constant dielectric material. The oxidizing method includes use of an ozone treatment.

Copper containing conductor materials are likely to be of continued importance as microelectronic structure and microelectronic device dimensions decrease. To that end desirable are compositions and methods for use thereof that provide copper containing conductor materials within microelectronic structures with enhanced performance and reliability.

SUMMARY

The invention includes a composition that may be used for cleaning a copper containing conductor layer within a microelectronic structure. The invention also includes: (1) a method for cleaning the copper containing conductor layer within the microelectronic structure while using the composition; as well as (2) a method for cleaning a dielectric layer and the copper containing conductor layer within the microelectronic structure while using the composition.

The particular composition in accordance with the invention comprises an aqueous acid that beneficially includes an oxidant material (i.e., an oxidant) as well as a passivant material (i.e., a passivant) contained within the aqueous acid, but not an abrasive material. The particular composition in accordance with the invention is useful for cleaning a reactive ion etch residue from a copper containing conductor layer within a microelectronic structure and a dielectric layer through which is etched an aperture to access the copper containing conductor layer within the microelectronic structure, while using a reactive ion etch method that provides the reactive ion etch residue. The particular composition in accordance with the invention is useful when the foregoing dielectric layer comprises a generally lower dielectric constant dielectric material.

Additionally, while it is understood that a copper containing conductor material is a particularly desirable metal conductor material which may be cleaned in accordance with the invention, the invention is not necessarily so limited. Rather, the invention also contemplates applicability for other metal materials that are similar to a copper containing conductor material that may be susceptible to both: (1) a mild oxidation with an oxidant in accordance with the invention; as well as (2) passivation with a passivant in accordance with the invention. Such metal materials may include, but are not necessarily limited to other transition metals, such as but not limited to nickel, cobalt, titanium and silver base metals, and metal alloys of the foregoing base metals.

A composition in accordance with the invention includes an aqueous acid. The composition also includes an oxidant contained within the aqueous acid. The composition also includes a passivant contained within the aqueous acid. The composition does not include an abrasive material.

A particular method for treating a microelectronic structure in accordance with the invention includes processing a microelectronic substrate to provide a processed microelectronic substrate that includes a metal containing conductor layer having a residue located upon the metal containing conductor layer. The method also includes removing the reside from the metal containing conductor layer and passivating the metal containing conductor layer to form a passivated metal containing conductor layer while using a composition. The composition includes: (1) an aqueous acid; (2) an oxidant contained in the aqueous acid; and (3) a passivant contained in the aqueous acid. The composition does not include an abrasive material.

Another particular method for treating a microelectronic structure includes etching an aperture through a dielectric layer located over a substrate to expose a metal containing conductor layer located interposed between the dielectric layer and the substrate. The etching provides a residue upon at least one of the dielectric layer and the metal containing conductor layer. The method also includes removing the reside from the at least one of the dielectric layer and the metal containing conductor layer, and sequentially passivating the metal containing conductor layer to form a passivated metal containing conductor layer, while using a composition. The composition includes: (1) an aqueous acid; (2) an oxidant contained in the aqueous acid; and (3) a passivant contained in the aqueous acid. The composition does not include an abrasive material.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes: (1) a composition that may be used for cleaning and passivating a metal conductor layer, such as but not limited to a copper containing conductor layer, within a microelectronic structure; as well as (2) a method for cleaning and passivating the metal layer such as the copper containing conductor layer, and optionally additional adjoining layers within the microelectronic structure, is understood within the context of the description that follows. The description that follows is understood within the context of the drawings described above. Since the drawings are intended for illustrative purposes, the drawings are not necessarily drawn to scale.

FIG. 1 to FIG. 6 show a series of schematic cross-sectional diagrams illustrating the results of progressive stages in forming and cleaning a residue within a microelectronic structure in accordance with a particular embodiment of the invention. This particular embodiment comprises a preferred embodiment of the invention. The residue is typically a reactive ion etch residue that is formed within the microelectronic structure when etching an aperture through a dielectric layer located over a substrate to access a metal conductor layer, such as but not limited to a copper containing conductor layer, located interposed between the dielectric layer and the substrate. The residue is located typically upon both the dielectric layer and the metal conductor layer. For clarity in presentation, following portions of this disclosure will describe the instant embodiment within the context of a copper containing conductor layer, although in accordance with disclosure above, neither the embodiment nor the invention is necessarily so limited.

Figure 1:
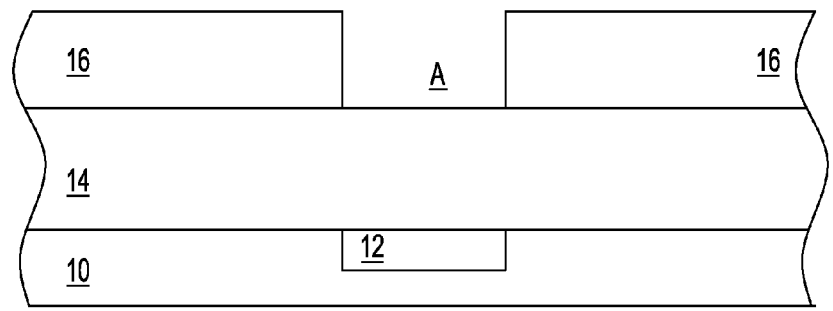
FIG. 1 to FIG. 6 show a series of schematic cross-sectional diagrams illustrating the results of progressive stages in forming and cleaning a residue within a microelectronic structure in accordance with an embodiment of the invention.

FIG. 1 shows a schematic cross-sectional diagram of the microelectronic structure at an early stage in the processing thereof in accordance with the preferred embodiment. Specifically, FIG. 1 shows a substrate 10 that includes a copper containing conductor layer 12 located within the substrate 10. The copper containing conductor layer 12 may alternatively be located upon or over the substrate 10. A dielectric layer 14 is located upon the substrate 10 and the copper containing conductor layer 12. A photoresist layer 16 is located upon the dielectric layer 14. The photoresist layer 14 defines an aperture A that exposes the dielectric layer 14. The aperture A is located above the copper containing conductor layer 12.

The substrate 10 may comprise any of several materials that are conventionally used in the microelectronic fabrication art. Included in particular are ceramic and other dielectric substrate materials, as well as conductor substrate materials and semiconductor substrate materials. Also included are laminates and composites of the foregoing substrate materials. Ceramic and other dielectric substrate materials may include, but are not limited to alumina, silica, zirconia and titania ceramic dielectric substrate materials, as well as related glass dielectric substrate materials. Semiconductor substrate materials may include, but are not limited to bulk semiconductor substrates, semiconductor-on-insulator substrates and hybrid orientation substrates.

Bulk semiconductor substrates may comprise materials including but not limited to silicon, germanium, silicon-germanium alloy, silicon-carbon alloy, silicon-germanium-carbon alloy and compound (III-IV and II-VI) semiconductor materials. Non-limiting examples of compound semiconductor materials include gallium arsenide, indium arsenide and indium phosphide semiconductor materials.

Semiconductor-on-insulator substrates typically include a base semiconductor substrate that is separated from a surface semiconductor layer by a buried dielectric layer. The base semiconductor substrate and the surface semiconductor layer may comprise different or identical semiconductor materials with respect to chemical composition (as disclosed above with respect to bulk semiconductor substrates), dopant polarity, dopant concentration and crystallographic orientation. Hybrid orientation substrates generally comprise multiple regions of differing crystallographic orientation within a single semiconductor substrate. Semiconductor-on-insulator substrates and hybrid orientation substrates may be fabricated using methods including but not limited to layer transfer methods, layer lamination methods, epitaxial growth methods and ion implantation methods.

When the substrate 10 comprises any of the foregoing types of semiconductor substrates, the substrate 10 typically also includes semiconductor devices formed and located therein and/or thereupon. Such semiconductor devices may include, but are not limited to transistors and diodes. Also included are additional devices that need not necessarily be semiconductor devices. Such additional devices may include, but are not necessarily limited to, resistors and capacitors. The semiconductor devices and non-semiconductor devices may be connected and interconnected using patterned conductor layers (which may include, but are not necessarily limited to, the copper containing conductor layer 12) that are separated by dielectric layers (which may include, but are not necessarily limited to, the dielectric layer 14).

The copper containing conductor layer 12 may comprise any of several copper containing conductor materials. Particular copper containing conductor materials include pure copper conductor materials, as well as copper containing conductor materials that include any one or more of several conductor and non-conductor alloying materials. Typically, the copper containing conductor material comprises a pure copper conductor material or a copper alloy conductor material having a copper weight percentage of at least about 95 weight percent and more preferably from about 98 to about 99.9 weight percent.

Although not specifically illustrated within the schematic cross-sectional diagram of FIG. 1, the copper containing conductor layer 12 may comprise a barrier layer at the periphery thereof that is in contact with a portion of the substrate 10 that may comprise a dielectric material. Such a barrier layer is desirable to attenuate inter-diffusion of a copper containing conductor material from which may be comprised the copper containing conductor layer 12 and a dielectric material from which may be comprised a portion of the substrate 10.

Non-limiting examples of barrier materials that may be used at the periphery of the copper containing conductor layer 12 include both conductor barrier materials and dielectric barrier materials. Conductor barrier materials are more common and include, but are not limited to, conductor materials such as titanium, tungsten and tantalum conductor materials. Also included, and also not limiting, are titanium nitride, tungsten nitride and tantalum nitride conductor materials. Dielectric barrier materials often include, but are not limited to, nitrides or oxynitrides, particularly of silicon. Nitrides and oxynitrides of other elements are not excluded. The barrier layers, whether comprised of dielectric barrier materials or conductor barrier materials, may be formed to a thickness from about 10 to about 250 angstroms. As appropriate, conductor barrier materials and dielectric barrier materials may be formed using methods including but not limited to thermal or plasma oxidation or nitridation methods, plating methods, chemical vapor deposition methods (i.e., including atomic layer chemical vapor deposition methods) and physical vapor deposition methods (including sputtering methods).

The dielectric layer 14 may comprise any of several dielectric materials that may preferably withstand exposure to the composition in accordance with the instant embodiment. The composition is disclosed in further detail below. Such dielectric materials may comprise generally conventional dielectric materials that have a comparatively generally higher dielectric constant (i.e., greater than about 4 and in a range from greater than about 4 to about 20), such as but not limited to silicon oxide, silicon nitride and silicon oxynitride dielectric materials. Of more particular interest within the context of the instant embodiment is that the dielectric layer 14 may alternatively comprise a generally lower dielectric constant dielectric material (i.e., less than about 4.0 and more preferably from about 2 to less than about 4). Non-limiting examples of these generally lower dielectric constant dielectric materials include spin-on-glass dielectric materials, spin-on-polymer dielectric materials, fluorine doped silicon oxide dielectric materials, carbon doped silicon oxide dielectric materials, nanoporous dielectric materials and microporous dielectric materials. Such comparatively low dielectric constant dielectric materials provide an advantage within the context of the instant embodiment insofar as such comparatively low dielectric constant dielectric materials provide for a generally reduced level of cross-talk between the copper containing conductor layer 12 and any other adjacent conductor layers (whether comprising copper containing conductor materials or other than copper containing conductor materials) within the microelectronic structure whose schematic cross-sectional diagram is illustrated in FIG. 1.

The foregoing dielectric materials that may be used for forming the dielectric layer 14 may also be formed using methods that are appropriate to their material(s) of composition. Non-limiting examples include spin-coating methods, ion implantation methods, chemical vapor deposition methods and physical vapor deposition methods. Typically, the dielectric layer 14 comprises a carbon and hydrogen doped silicon oxide dielectric material (i.e., SiOCH) that has a thickness from about 500 to about 15000 angstroms, although the invention is not limited to such a dielectric material and such a thickness.

The photoresist layer 16 may comprise any of several photoresist materials. Non-limiting examples include positive photoresist materials, negative photoresist materials and hybrid photoresist materials (where hybrid photoresist materials may exhibit characteristics of both positive photoresist materials and negative photoresist materials). Typically, although not exclusively, the photoresist layer 16 comprises a positive photoresist material or a negative photoresist material, either of which may have a generally conventional thickness. As disclosed above, the photoresist layer 16 also defines the aperture A, which comprises generally conventional dimensions, that is preferably at least nominally centered above the copper containing conductor layer 12.

Figure 2:
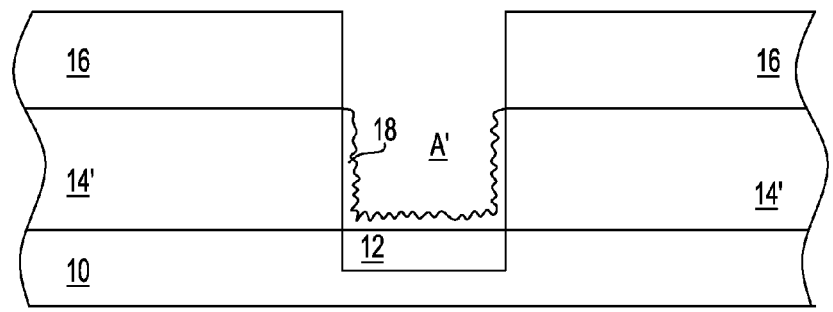

FIG. 2 shows the results of etching the dielectric layer 14 that is illustrated in FIG. 1, to provide a dielectric layer 14', while using the photoresist layer 16 as an etch mask layer. The dielectric layer 14' in turn defines an aperture A' that exposes the copper containing conductor layer 12.

The dielectric layer 14 may be etched to provide the dielectric layer 14' that exposes the copper containing conductor layer 12 while using etch methods including but not limited to wet chemical etch methods and dry plasma etch methods. Dry plasma etch methods are generally particularly desirable insofar as dry plasma etch methods provide generally straighter sidewalls to the dielectric layer 14' that is illustrated in FIG. 2.

Such dry plasma etch methods will typically use an etchant gas composition appropriate to the material(s) from which is comprised the dielectric layer 14. Within the context of many of the materials from which may be comprised the dielectric layer 14 in accordance with disclosure above, such an etchant gas composition will often comprise a fluorine containing etchant gas.

As is further illustrated within the schematic cross-sectional diagram of FIG. 2, incident to etching the dielectric layer 14 that is illustrated in FIG. 1 to form the dielectric layer 14', a residue 18 is formed upon a portion of at least one, and often both, of the dielectric layer 14' and the copper containing conductor layer 12. The residue 18 may comprise an organic material (such as may be derived from the photoresist layer 16 or the dielectric layer 14 when the dielectric layer 14 is comprised of an organic dielectric material such as a spin-on-polymer material) as well as an inorganic material (such as is generally derived from the dielectric layer 12 when comprising an inorganic dielectric material). Also included within the residue 18, and also not limiting, are fluorine based residues that may result from a fluorine containing etchant gas composition. In addition to the presence of the residue 18 located thereupon, the dielectric layer 14' and the copper containing conductor layer 12 may also sustain reactive ion etch induced physical damage when etching through the dielectric layer 14 that is illustrated in FIG. 1 to provide the dielectric layer 14' that defines the aperture A' that exposes the copper containing conductor layer 12 that is illustrated in FIG. 2.

The instant embodiment is directed towards a composition (i.e., a composition of matter), and a related method that uses the composition, for cleaning (i.e., removing) the residue 18 from both the dielectric layer 14' and the copper containing conductor layer 12 that are illustrated in FIG. 2. In accordance with disclosure below, the composition also sequentially passivates the copper containing conductor layer 12. The foregoing cleaning and passivation provides that the microelectronic structure whose schematic cross-sectional diagram is illustrated in FIG. 2 may be more readily further fabricated to provide a functional and reliable microelectronic structure.

Figure 3:
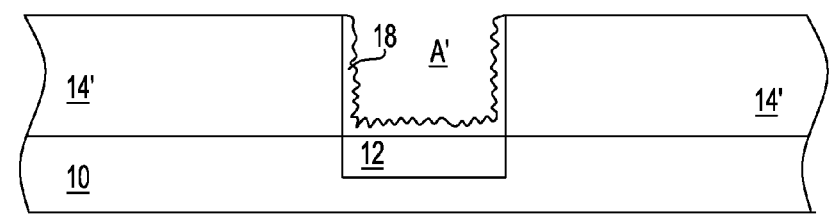

A preliminary process step in the process of achieving the foregoing goals is illustrated within the schematic cross-sectional diagram of FIG. 3. In that regard, FIG. 3 shows the results of stripping the photoresist layer 16 from the microelectronic structure whose schematic cross-sectional diagram is illustrated in FIG. 2. The photoresist layer 16 may be stripped from the microelectronic structure whose schematic cross-sectional diagram is illustrated in FIG. 2 to provide the microelectronic structure whose schematic cross-sectional diagram is illustrated in FIG. 3 while using photoresist stripping methods and materials that are otherwise generally conventional in the microelectronic fabrication art. Such photoresist stripping methods and materials often include oxygen containing dry plasma stripping methods and materials that may be supplemented with solvent based wet chemical stripping methods and materials.

Figure 4:
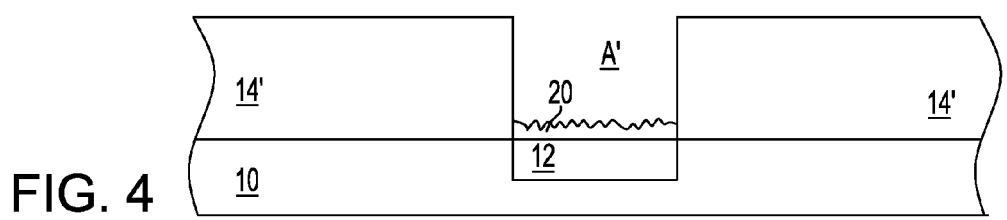

FIG. 4 first shows the results of stripping the residue 18 from the dielectric layer 14' and the copper containing conductor layer 12 within the microelectronic structure of FIG. 3. FIG. 4 also shows a passivant layer 20 located upon the copper containing conductor layer 12 after stripping therefrom the residue 18. The residue 18 may be stripped from the microelectronic structure whose schematic cross-sectional diagram is illustrated in FIG. 3 to provide in-part the microelectronic structure whose schematic cross-sectional diagram is illustrated in FIG. 4 while using a composition (i.e., a composition of matter) in accordance with the instant embodiment. Such a composition includes: (1) an aqueous acid that contains; (2) an oxidant material; and (3) a passivant material, but absent an abrasive material within the composition. The abrasive material is absent from the composition in accordance with the embodiment insofar as the composition in accordance with the embodiment is intended for purposes of cleaning and passivating a microelectronic structure, rather than for use as a polishing slurry for chemical mechanical polish planarizing a pertinent portion of the microelectronic structure.

Within the composition in accordance with the embodiment, the aqueous acid may be selected from the group including but not limited to hydrofluoric acid, acetic acid and oxalic acid, as well as mixtures of the foregoing acids. The embodiment does not preclude other aqueous acids that may include, but are not limited to aqueous inorganic acids or aqueous organic acids. Typically, the aqueous acid will have a concentration of acid within the composition from about 0.0001 to about 50 weight percent. A typical aqueous acid is 0.5% w/w hydrofluoric acid (i.e., HF) in deionized water. Other concentrations may be in a range from about 49% w/w to about 0.02% w.w.HF in water.

Within the composition in accordance with the embodiment, the oxidant material may be selected from the group including but not limited to oxygen, ozone and hydrogen peroxide. Particular conditions that influence the selection of the oxidant include that the oxidant: (1) promotes at least a slight oxidation of the copper containing conductor layer 12; (2) does not induce an irreversible reaction with the copper containing conductor layer 12; (3) does not promote formation of an unreliable alloy with the copper containing conductor layer 12; and (4) does not induce a significant degradation of the passivant. Thus, the embodiment optimally contemplates a generally low concentration of a generally mild oxidant (typically in the range of about −0.52 to about −1.25 volts in comparison with Normal Hydrogen Electrode (NHE) for a copper containing conductor layer 12 metallurgy system). Alternatively, the embodiment more generally contemplates that any oxidant that has an oxidation potential between about −0.16 and −2.10 volts in comparison with a Normal Hydrogen Electrode (NHE), and does not promote irreversible undesirable reactions with the copper containing conductor layer 12 (such as a sulfide of the copper containing conductor layer 12) would be a suitable oxidant.

The embodiment also contemplates an analysis at least similar, and preferably identical, to the above under circumstances where a conductor metal other than copper is used within the context of the copper containing conductor layer 12. Such other conductor metals contemplated within the context of the embodiment are specifically listed above, within the Summary.

In particular, the embodiment also generally does not contemplate metallic oxidants such as ionic metallic oxidants that are based upon metals or metal ions such as iron, cobalt, manganese or cerium based metals or metal ions. Such metallic oxidants may leave trace metal residues that are undesirable incident to further processing or operation of the microelectronic structure whose schematic cross-sectional diagram is illustrated in FIG. 4. Typically, the oxidant material will have a concentration within the aqueous acid from about 0.001 to about 1000 ppm by weight.

Within the composition in accordance with the embodiment, the passivant is intended as a passivant that has a specific affinity for a metal conductor material, such as the copper containing conductor material that comprises the copper containing conductor layer 12. A particularly desirable passivant is benzotriazole (BTA), although the invention is by no means so limited. Desirably, the passivant, such as benzotriazole, is a chelating amine passivant, although the invention is also not necessarily so limited. Alternative substituted amines comprising mono and poly amine functionality are not excluded from the instant embodiment. Additionally not excluded are passivants that bond to a copper surface through one or more oxygen bonds, (i.e., such as chelating carboxylic acid passivants) although such passivants may be less effective. Typically, the passivant is present in the composition in a range from about 10 to about 10000 ppm by weight.

The embodiment provides value by the simultaneous use of an oxidant material and a passivant material for removing the residue 18 from the microelectronic structure whose schematic diagram is illustrated in FIG. 3, while sequentially forming the passivant layer 20 upon a metal conductor layer, typically the copper containing conductor layer 12, to provide the microelectronic structure whose schematic cross-sectional diagram is illustrated in FIG. 4.

The composition of the instant embodiment may be used at room temperature or at an elevated temperature in a range from about 27 to about 80 degrees centigrade. The composition of the instant embodiment is used for a time period sufficient to remove the residue 18 from the microelectronic structure whose schematic cross-sectional diagram is illustrated in FIG. 3 and replace in-part the residue 18 with the passivant layer 20 that is illustrated in FIG. 4.

Figure 5:
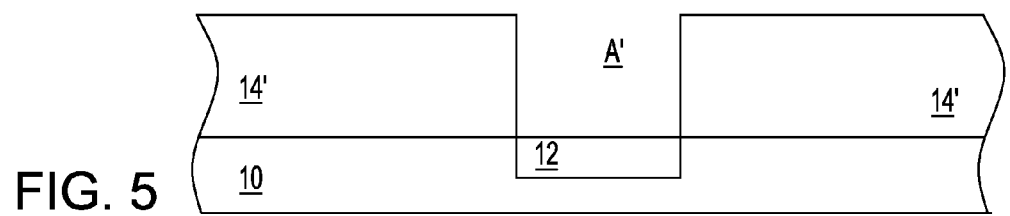

FIG. 5 shows the results of optionally removing the passivant layer 20 from the copper containing conductor layer 12 within the microelectronic structure of FIG. 4. Such removal of the passivant layer 20 may be desirable under certain circumstances, to provide optimal functionality and performance of a microelectronic structure that results from further processing of the microelectronic structure whose schematic cross-sectional diagram is illustrated in FIG. 5.

Removal of the passivant layer 20 may be effected using methods and materials that are appropriate to the composition of the passivant material that comprises the passivant layer 20. For less highly coordinately bound passivant materials (i.e., lesser chelating or non-chelating passivant materials) a thermal desorption treatment in an evacuated chamber (i.e., in a range from about 10E-4 to 10E-10 atmospheres) with an inert atmosphere that is sealed against oxidative species, and at a temperature from about 200 to about 450 degrees centigrade for a time period from about 0.5 to about 5 minutes, may be sufficient. For more highly coordinately bound passivant materials an appropriate solvent treatment may alternatively be used, or as a further alternative certain types of plasma treatments, reactive ion treatments, or ion sputtering treatments may also be used.

Figure 6:
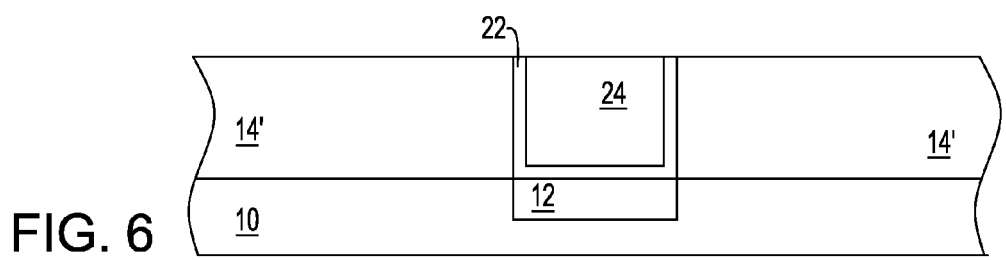

FIG. 6 first shows a liner layer 22 formed conformally into the aperture A' that is illustrated in FIG. 5. FIG. 6 also shows a second copper containing conductor layer 24 located upon the liner layer 22. Within the instant embodiment, the liner layer 22 comprises a conductor liner material. The conductor liner material may be analogous, equivalent or identical with the conductor liner material (i.e., the conductor barrier material) that is disclosed above within the context of the copper containing conductor layer 12. Similarly, the second copper containing conductor layer 24 may comprise copper containing materials, have dimensions and be formed using methods analogous, equivalent or identical to the materials, dimensions and methods that are used for forming the copper containing conductor layer 12, as disclosed above within the context of FIG. 1.

As is understood by a person skilled in the art, the liner layer 22 and the second copper containing conductor layer 24 typically result from a planarization of corresponding blanket layers that are formed conformally upon the microelectronic structure whose schematic cross-sectional diagram is illustrated in FIG. 5.

FIG. 6 shows a schematic cross-sectional diagram of a microelectronic structure in accordance with a preferred embodiment of the invention. Within the microelectronic structure a residue 18 which was formed upon the dielectric layer 14' and the adjacent copper containing conductor layer 12, was cleaned (i.e., removed) therefrom while using a composition in accordance with the embodiment. The composition in accordance with the embodiment sequentially provided a passivant layer 20 formed upon the copper containing conductor layer 12. Such a composition in accordance with the embodiment includes: (1) an aqueous acid that contains; (2) an oxidant material; and (3) a passivant material, but absent an abrasive material within the composition.

For purposes of illustrating the value of a composition in accordance with the foregoing disclosed composition, a series of test substrates was prepared. The test substrates included silicon semiconductor substrates upon which were deposited in sequence: (1) a tantalum nitride layer of thickness about 100 angstroms; (2) a tantalum layer of thickness about 300 angstroms; and (3) a copper layer of thickness about 10000 angstroms. The exposed copper surfaces were then treated with any one of five chemical treatments that are described in further detail below. After exposure to room temperature atmosphere for about 1 week after any of the five treatments, the treated copper layer was capped with a 100 angstrom thick layer of tantalum nitride followed by a 300 angstrom thick layer of tantalum. The resulting test substrates were then depth profiled using a secondary ion mass spectroscopy (SIMS) technique. The depth profiles were evaluated to determine oxygen concentration profiles at an upper copper to tantalum nitride interface (i.e., an interfacial oxygen concentration).

The specific copper surface treatments that were evaluated in accordance with the foregoing test structures included: (1) an immersion treatment in an acidic based copper etchant having an etch rate of about 750 angstroms per minute at a temperature of about 27 degrees centigrade for a time period of about 0.5 minutes; (2) a 0.5 weight percent acetic acid solution immersion treatment at a temperature of about 25 degrees centigrade for a time period of about 0.5 minutes; (3) an average 1.5 weight percent hydrofluoric acid solution immersion treatment at a temperature of about 25 degrees centigrade for a time period of about 108 seconds; (4) a superficial chemical mechanical polish planarizing treatment using a slurry composition that included 0.5 weight percent benzotriazole as a passivant, in the presence of air; and (5) a repetition of treatment (4), followed by a 20 min water overflow rinse (i.e., this treatment is intended to illustrate an effect of an extensive water rinse upon a benzotriazole passivant stability upon a copper containing conductor layer surface). The above described oxygen concentration profile results are listed in Table I, as follows.

TABLE I

| Copper Treatment | Interfacial Oxygen Conc. Atoms/cm$^2$ |
| --- | --- |
| Copper Etchant Immersion | 1.1 E 16 |
| Acetic Acid Immersion | 3.2 E 15 |
| Hydrofluoric Acid Immersion | 1.4 E 16 |
| CMP with Benzotriazole + Oxygen | 4.0 E 14 |
| Aqueous Benzotriazole + Water Rinse | 8.8 E 15 |

From review of the data in Table I, it is clear that the use of an oxidant and a passivant when treating a copper containing conductor layer is beneficial to inhibit further oxidation of the copper containing conductor layer. Additionally, the data within Table I also illustrates that a protective passivant layer may be reversibly bound to a copper containing conductor layer, and may be selectively removed therefrom dependant upon processing conditions.

The preferred embodiment is illustrative of the invention rather than limiting of the invention. Revisions and modifications may be made to materials, structures and dimensions of a composition and method for use thereof in accordance with the foregoing preferred embodiment, while still providing a composition and method for use thereof in accordance with the invention, further in accordance with the accompanying claims.

What is claimed is:

1. A method for treating a microelectronic structure comprising:

processing a microelectronic substrate to provide a processed microelectronic substrate that includes a Cu-containing conductor layer having a residue located upon the Cu-containing conductor layer, said processing including at least reactive ion etching which produces said residue;

removing the residue from the Cu-containing conductor layer and passivating the Cu-containing conductor layer to form a passivated Cu-containing conductor layer while using a composition that comprises:

an aqueous acid selected from the group consisting of hydrofluoric, acetic and oxalic acids;

an oxidant selected from the group consisting of molecular oxygen, ozone and hydrogen peroxide contained in the aqueous acid; and a passivant selected from the group consisting of benzotriazole, other chelating amines and chelating carboxylic acids contained in the aqueous acid, the composition not including an abrasive material;

unpassivating the passivated Cu-containing conductor layer to provide an unpassivated Cu-containing conductor layer; and forming an additional conductor layer upon the unpassivated Cu-containing conductor layer.

* * * * *